(12) United States Patent
Chiu et al.

(10) Patent No.: US 8,296,696 B1
(45) Date of Patent: Oct. 23, 2012

(54) METHOD AND APPARATUS FOR PERFORMING SIMULTANEOUS REGISTER RETIMING AND COMBINATIONAL RESYNTHESIS DURING PHYSICAL SYNTHESIS

(75) Inventors: Gordon Raymond Chiu, Richmond Hill (CA); Deshanand Singh, Mississauga (CA); Valavan Manohararajah, Scarborough (CA); Ivan Blunno, Woodbridge (CA); Stephen D. Brown, Toronto (CA)

(73) Assignee: Altera Corporation, San Jose, CA (US)

( * ) Notice: Subject to any disclaimer, the term of this patent is extended or adjusted under 35 U.S.C. 154(b) by 1204 days.

(21) Appl. No.: 12/075,488

(22) Filed: Mar. 12, 2008

(51) Int. Cl.
*G06F 17/50* (2006.01)
(52) U.S. Cl. .................................. 716/104; 716/132
(58) Field of Classification Search ........... 716/100–139
See application file for complete search history.

(56) References Cited

U.S. PATENT DOCUMENTS

| | | | |
|---|---|---|---|
| 6,546,539 B1 * | 4/2003 | Lu et al. | 716/104 |
| 7,120,883 B1 * | 10/2006 | van Antwerpen et al. | 716/102 |
| 7,337,100 B1 * | 2/2008 | Hutton et al. | 703/13 |
| 7,735,047 B1 * | 6/2010 | Anderson et al. | 716/116 |
| 2005/0258517 A1 * | 11/2005 | Oberlaender et al. | 257/666 |
| 2007/0271543 A1 * | 11/2007 | Alpert et al. | 716/13 |

* cited by examiner

*Primary Examiner* — Vuthe Siek
*Assistant Examiner* — Aric Lin
(74) *Attorney, Agent, or Firm* — L. Cho

(57) ABSTRACT

A method for designing a system on a target device includes synthesizing the system. The system is mapped. The system is placed on the target device. Physical synthesis is performed on the system by identifying a plurality of register retiming solutions for each register in the system, performing combinational resynthesis on each of the register retiming solutions, and selecting a combinational resynthesis solution for the system.

21 Claims, 19 Drawing Sheets

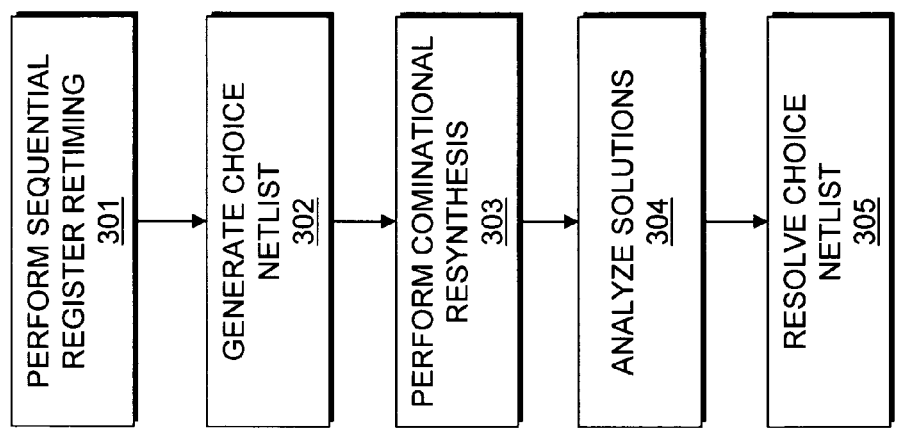

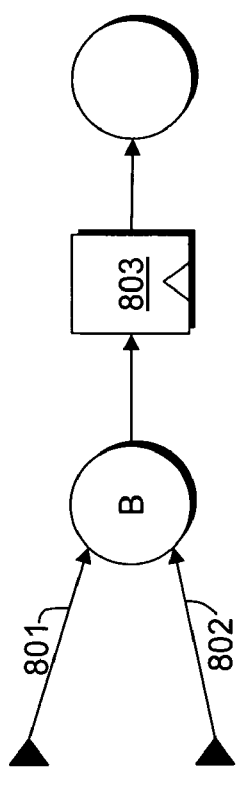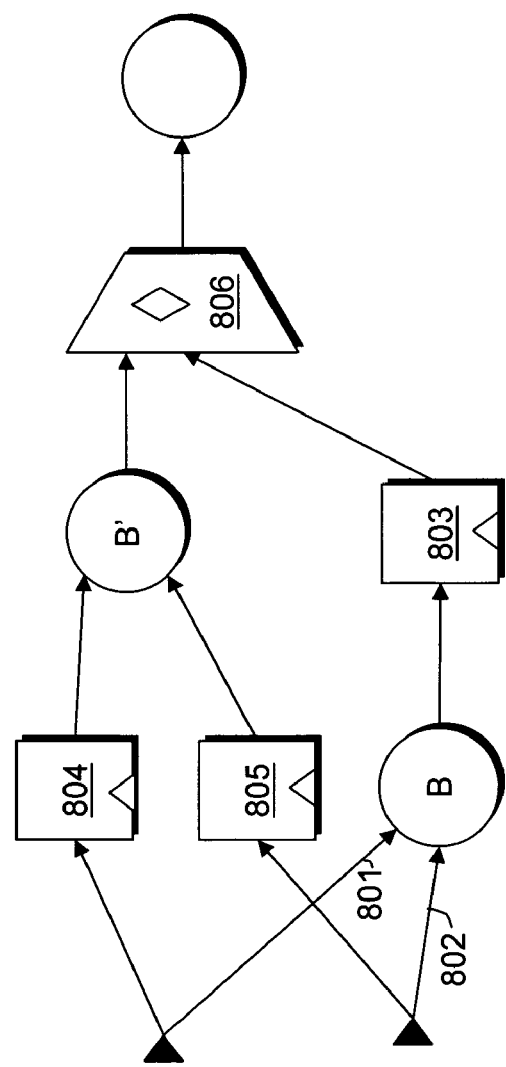
FIG. 8A
FIG. 8B

METHOD AND APPARATUS FOR PERFORMING SIMULTANEOUS REGISTER RETIMING AND COMBINATIONAL RESYNTHESIS DURING PHYSICAL SYNTHESIS

TECHNICAL FIELD

Embodiments of the present invention relate to tools such as electronic design automation (EDA) tools for designing systems on field programmable gate arrays (FPGAs). More specifically, embodiments of the present invention relates to a method and apparatus for performing simultaneous register retiming and combinational resynthesis during physical synthesis.

BACKGROUND

FPGAs are used to implement large systems that include million of gates and megabits of embedded memory. The complexity of large systems often requires the use of EDA tools to create and optimize a design for the system onto physical target devices. Among the procedures performed by EDA tools in a computer aided design (CAD) flow are synthesis, technology mapping, clustering, placement, and routing.

In the past, physical synthesis was optionally used to perform a series of circuit transformations to optimize the design of the system for one or more given goals. The goals may include optimizing a path to meet a specific user timing constraint, reducing area required to implement a circuit, reducing static or dynamic power consumption, increasing the routability of a design, or other goal. Unlike traditional synthesis, physical synthesis may take into account the technology and architecture of the target device and delays associated with signals on the target device while performing the circuit transformations to optimize the design of the system. Most of the delays in an FPGA circuit are due to the programmable routing network. These delays cannot be determined with great certainty until the routing step is completed. The traditional logic synthesis step of the FPGA CAD flow is responsible for creating a circuit implementation that will realize the functionality of a designer's hardware specification. At this early stage of the CAD flow, it is difficult to predict the delays of routed connections. Physical synthesis allows netlist transformations to be performed before and after clustering and placement. Physical synthesis's relatively late position in the CAD flow allows it to take advantage of more accurate estimates of the delays of routed connections available.

SUMMARY

According to an embodiment of the present invention, sequential register retiming and combinational resynthesis are performed simultaneously during physical synthesis. In this embodiment, all possible sequential register retiming solutions are identified. In one embodiment, each retiming solution includes a set of positions (alternatives) for all registers in the circuit. Alternatively, the solutions may include more than one register retiming solution for each register. Afterwards, combinational resynthesis is performed on all the possible sequential register retiming solutions. This approach identifies circuit implementations that would not otherwise be identified using traditional techniques that apply combinational resynthesis and sequential register retiming procedures in a greedy fashion alternatively.

According to an embodiment of the present invention, the identified sequential register retiming solutions are represented on a choice netlist. The choice netlist includes choice nodes to allow a portion of the choice netlist for one retiming solution to also be used as part of one or more other retiming solutions. This allows the size of the choice netlist to be smaller than the size of a netlist that represents each of the register retiming solutions separately. By coalescing the register retiming solutions into a choice netlist, a smaller, more manageable type of netlist is created which may be more efficiently processed and stored.

BRIEF DESCRIPTION OF THE DRAWINGS

The features and advantages of the present invention are illustrated by way of example and are by no means intended to limit the scope of the present invention to the particular embodiments shown.

FIG. 3 is a flow chart illustrating a method for performing physical synthesis according to an exemplary embodiment of the present invention.

FIGS. 8a and 8b illustrate an example of performing backward push register retiming according to an exemplary embodiment of the present invention.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
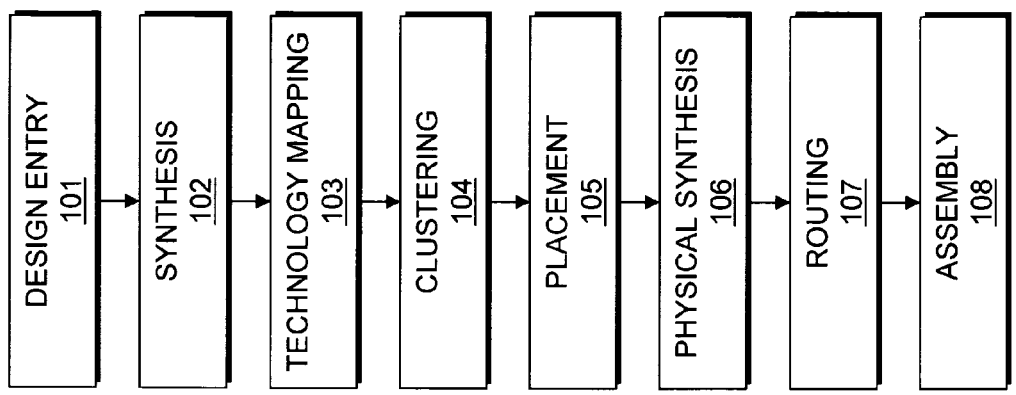
FIG. 1 is a flow chart illustrating a method for designing a system on a target device according to an exemplary embodiment of the present invention.

FIG. 1 is a flow chart illustrating a method for designing a system on a target device according to an embodiment of the present invention. The procedure shown in FIG. 1 may be performed by an EDA tool such as a system designer implemented on a computer system. At 101, a design for the system is entered into a design tool. The design may be described at a gate level or in a more abstract level. The design may be described in terms of a hardware description language (HDL) such as VHDL or Verilog. The target device may be an ASIC, structured ASIC, FPGA, programmable logic device (PLD), or other target device.

At 102, the system is synthesized. Synthesis includes generating a logic design of the system to be implemented. According to an embodiment of the present invention, synthesis generates an optimized logical representation of the system from a HDL design definition. The optimized logical representation of the system may include a representation that has a minimized number of functional blocks and registers, such as logic gates and logic elements, required for the system.

At 103, technology mapping is performed on the optimized logic design. Technology mapping includes determining how to implement logic gates and logic elements in the optimized logic representation with resources available on the target device. The resources available on the target device may be referred to as "cells" or "components" and may include logic-array blocks, registers, memories, digital signal processing blocks, input output elements, and other components. According to an embodiment of the present invention, a netlist is generated from mapping. This netlist may be an optimized technology-mapped netlist generated from the HDL.

At 104 clustering is performed. Clustering may include grouping technology mapped circuit into a set of one or more clusters. The clusters may be implemented with components on the target device such as logic array blocks. Clustering may reduce the size of a design which is to be placed.

At 105, the mapped logical system design is placed. Placement works on the optimized technology-mapped netlist to produce a placement for each of the functional blocks. According to an embodiment of the present invention for a target device that is a structured ASIC, placement includes fitting the system on the target device by determining which components on the logic design are to be used for specific logic elements, and other function blocks.

At 106, physical synthesis is performed. Physical synthesis may be used to perform a series of circuit transformations to optimize a circuit in a system such that a delay of a signal in the system is reduced, the area required for implementing the system on the target device is reduced, the power required to operate the system is reduced, to improve the routability of the system, and/or to achieve other goals. Physical synthesis is shown in FIG. 1 to be performed after placement 105 and before routing 107. It should be appreciated that physical synthesis may also be performed before and after the clustering 104 and placement 105 procedures.

Most of the delays in an FPGA circuit are due to the programmable routing network. These delays cannot be determined with great certainty until routing is completed. The traditional logic synthesis procedure at 102 is responsible for creating a circuit implementation that will realize the functionality of a designer's hardware specification. At this early stage of the design flow it is difficult to predict the delays of routed connections. It is for this reason that traditional logic synthesis may create circuit structures that are sub-optimal in terms of critical path performance. By performing physical synthesis at later stages of the design flow, better estimations of routed delays may be predicted and used to perform optimizations to reduce the delays.

The amount of area required to implement a circuit on an FPGA is known after technology mapping, when the circuit is mapped from a generic technology independent gate-level netlist representation to specific combinatorial and registered elements. Prior to the technology mapping procedure 103 of the design flow, it is difficult to predict the final area requirement of the circuit. It is for this reason that traditional logic synthesis may choose, in the interest of other cost metrics such as performance, an implementation for a circuit that is sub-optimal in terms of area. By performing physical synthesis after technology mapping 103, information regarding the area required to implement the circuit is available. Several techniques of optimizing the circuit structure to improve area may be employed during physical synthesis including mapping over-used resources (such as combinational lookup tables) to unused resources (such as memories).

Performing physical synthesis after the technology mapping procedure 103 of the design flow is well suited to reduce the amount of dynamic power consumed by the system. Signals with a high toggle rate can be identified and moved forward through the cone of logic so that fewer levels of logic toggle. Physical synthesis may reduce the wirelength and thus capacitance of signals with a high toggle rate. Physical synthesis may also use programmable inverters to bias the distribution of high and low signals when one signal utilizes less power than others.

For most circuits, the final routing connections chosen are very close to the optimal, shortest connections available for the given placement. A subset of designs are considered difficult to route, for which it may not be possible to find a legal route, or find a routing that preserves the performance of the circuit. Optimizing for routability may entail reducing the total wirelength usage of the circuit and reducing the contention for highly used and often congested wired segments. Physical synthesis performed prior to placement benefit from having high flexibility. Performing physical synthesis after placement allows physical synthesis to have access to accurate prediction of wirelength. This allows estimates to be made of probable congestion.

At 107, it is determined which routing resources should be used to connect the components in the logic design implementing the functional blocks of the system. During routing, routing resources on the target device are allocated to provide interconnections between logic gates, logic elements, and other components on the target device. The routing procedure may be performed by a router in an EDA tool that utilizes routing algorithms.

At 108, an assembly procedure is performed. The assembly procedure involves creating a data file that includes information determined by the procedures described by one or more of 101-108. The data file may be a bit stream that may be used to program the target device. According to an embodiment of the present invention, the procedures illustrated in FIG. 1 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the data file or other aspects of the design of the system may also be output in other forms such as on a display device or other medium.

Figure 2:
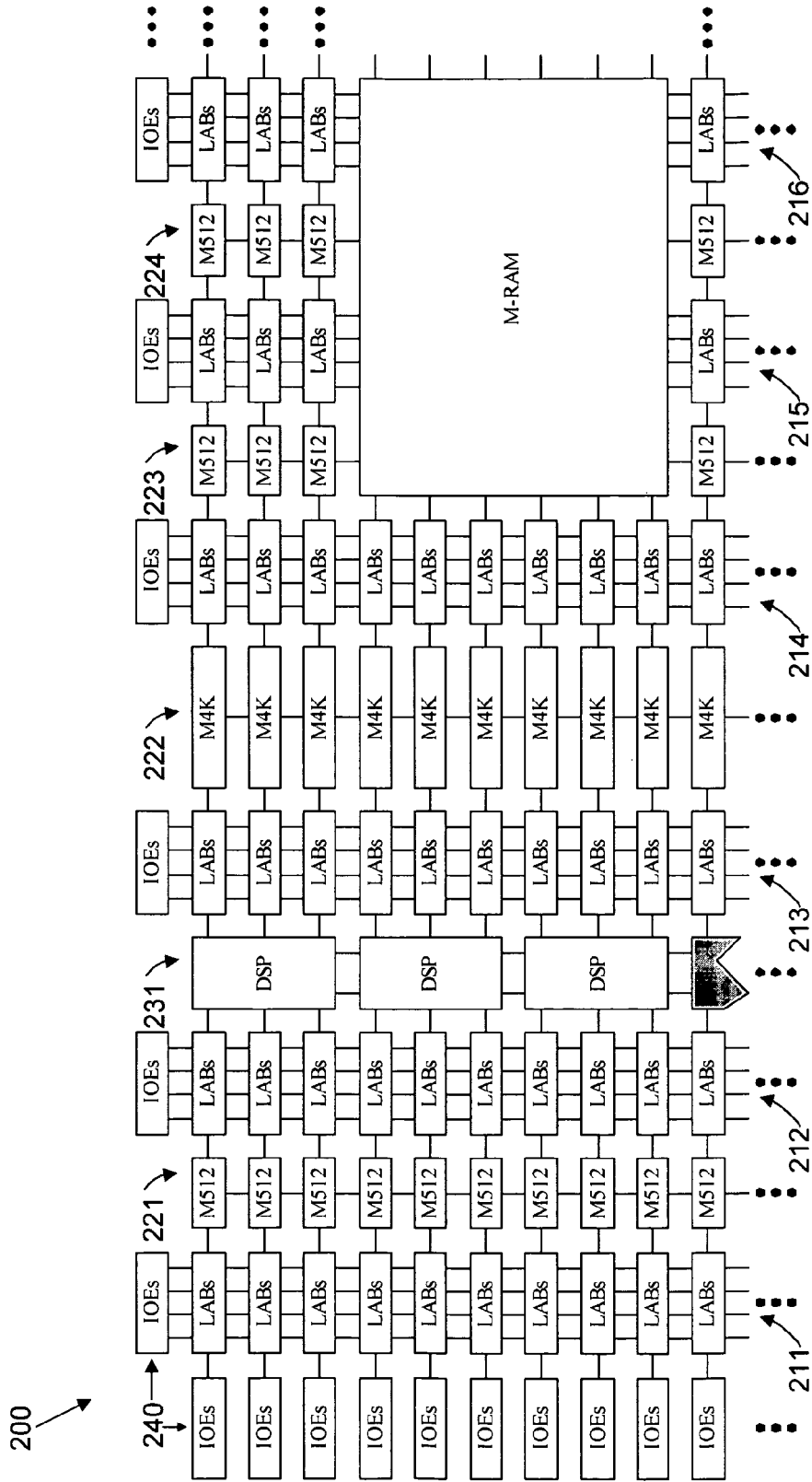
FIG. 2 illustrates an exemplary target device according to an exemplary embodiment of the present invention.

FIG. 2 illustrates an exemplary target device 200 in which a system may be implemented on 200 utilizing an FPGA according to an embodiment of the present invention. According to one embodiment, the target device 200 is a chip having a hierarchical structure that may take advantage of wiring locality properties of circuits formed therein.

The target device 200 includes a plurality of logic-array blocks (LABs). Each LAB may be formed from a plurality of logic blocks, carry chains, LAB control signals, (lookup table) LUT chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in Stratix™ manufactured by Altera® Corporation, or a combinational logic block (CLB) such as those found in Virtex™ manufactured by Xilinx® Inc. In this embodiment, the logic block may include a four input lookup table (LUT) with a configurable register. LUT chain connections transfer the output of one logic block LUT to the adjacent logic block for fast sequential LUT connections within the same LAB. Register chain connection lines transfer the output of one logic block register to the adjacent logic block's register within a LAB. According to an alternate embodiment of the present invention, the logic block may operate similarly to an adaptive logic module (ALM), such as those found in Stratix™ manufactured by Altera® Corporation. In this embodiment, the logic block may include 2 registers, 2 sets of addition circuitry, a combinational logic module that may be configured to implement two single six input LUT, or two LUTs with five or fewer inputs. LABs are grouped into rows and columns across the target device 200. Columns of LABs are shown as 211-216. It should be appreciated that the logic block may include additional or alternate components.

According to an embodiment of the present invention, additional registers are available for implementing logic functions with the logic blocks in the target device. The additional registers may be associated with a LAB or a subset of logic blocks within a LAB. The registers may be independent registers that are not associated with a specific logic block. Alternatively, the registers may be integrated inside logic blocks.

The target device 200 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 200. Columns of memory blocks are shown as 221-224.

The target device 200 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 200 and are shown as 231.

The target device 200 includes a plurality of input/output elements (IOEs) 240. Each IOE feeds an I/O pin (not shown) on the target device 200. The IOEs are located at the end of LAB rows and columns around the periphery of the target device 200. Each IOE includes a bidirectional I/O buffer and a plurality of registers for registering input, output, and output-enable signals. When used with dedicated clocks, the registers provide performance and interface support with external memory devices.

The target device 200 includes LAB local interconnect lines (not shown) that transfer signals between LEs in the same LAB. The LAB local interconnect lines are driven by column and row interconnects and LE outputs within the same LAB. Neighboring LABs, memory blocks, or DSP blocks may also drive the LAB local interconnect lines through direct link connections.

The target device 200 also includes a plurality of row interconnect lines ("H-type wires") (not shown) that span fixed distances. Dedicated row interconnect lines, route signals to and from LABs, DSP blocks, and memory blocks within the same row. The row interconnect lines may span a distance of up to four, eight, and twenty-four LABs respectively, and are used for fast row connections in a four-LAB, eight-LAB, and twenty-four-LAB region. The row interconnects may drive and be driven by LABs, DSP blocks, RAM blocks, and horizontal IOEs.

The target device 200 also includes a plurality of column interconnect lines ("V-type wires") (not shown) that operate similarly to the row interconnect lines. The column interconnect lines vertically routes signals to and from LABs, memory blocks, DSP blocks, and IOEs. Each column of LABs is served by a dedicated column interconnect, which vertically routes signals to and from LABs, memory blocks, DSP blocks, and IOEs. The column interconnect lines may traverse a distance of four, eight, and sixteen blocks respectively, in a vertical direction.

FIG. 2 illustrates an exemplary embodiment of a target device. It should be appreciated that a system may include a plurality of target devices, such as that illustrated in FIG. 2, cascaded together. It should also be appreciated that the target device may include programmable logic devices arranged in a manner different than that on the target device 200. A target device may also include FPGA resources other than those described in reference to the target device 200. Thus, while the invention described herein may be utilized on the architecture described in FIG. 2, it should be appreciated that it may also be utilized on other architectures employed by Altera® Corporation and Xilinx® Inc.

FIG. 3 is a flow chart illustrating a method for performing physical synthesis according to an exemplary embodiment of the present invention. The method for performing physical synthesis as shown in FIG. 3 may be implemented at 106 as shown in FIG. 1. At 301, sequential register retiming is performed on the design for the system. Register retiming is a logic optimization technique for synchronous circuits. This technique moves registers across combinational circuit elements to reduce the length of timing-critical paths. Register retiming is performed on the entire design of the system such that all register retiming solutions are identified. According to one embodiment, each retiming solution includes a set of positions (alternatives) for all registers in the circuit. More than one register retiming solution may be generated for each register in the system. According to an embodiment of the present invention, a limit is placed on retiming solutions that are identified. A range of registers, R, may be defined as the maximum number of combinational nodes a register can be pushed across. Performing pushes repeatedly will yield a choice netlist of size bounded by $O(n2^R)$, where n is the size of an original netlist At 302 a choice netlist is generated to represent the register retiming solutions identified at 301. According to an embodiment of the present invention, the choice netlist includes choice nodes which allow alternative solutions to be represented. Choice nodes allow a portion of the choice netlist for one retiming solution to be used as a part of one or more other retiming solutions. This allows a designer or an EDA tool to efficiently store a plurality of alternative solutions associated with a register without requiring the designer or EDA tool to accept a particular solution. FIG. 3 illustrates the register retiming procedure and the generation of the choice netlist as two distinct procedures. It should be appreciated that 301 and 302 may be implemented with a single procedure.

At 303, combinational resynthesis is performed on the register retiming solutions identified. According to an embodiment of the present invention, the combinational resynthesis may be performed on the choice netlist generated at 302. Combinational resynthesis operates to modify combinational logic reduce the length of timing-critical paths. Combinational resynthesis may include procedures such as decomposition (functional decomposition or Shannon's decomposition), Boolean division, and/or other procedures.

At 304, the combinational resynthesis solutions generated at 303 are analyzed. According to an embodiment of the present invention, analyzing the combinational resynthesis solutions includes evaluating the choice netlist which represents a plurality of candidates of alternate implementations of an original netlist with both register retiming and combinational resynthesis moves. Each unique permutation of the choice node configurations results in a different netlist. Each permutation is a configuration of the choice netlist. According to one embodiment, all possible configurations are analyzed to determine which one results in the best final netlist. The best final netlist may include the configuration of the choice netlist that yields the highest performance, lowest maximum register-to-register delay, or other characteristic.

At 305, the best final netlist determined at 304 is designated as the netlist for the system design.

Figure 4A:
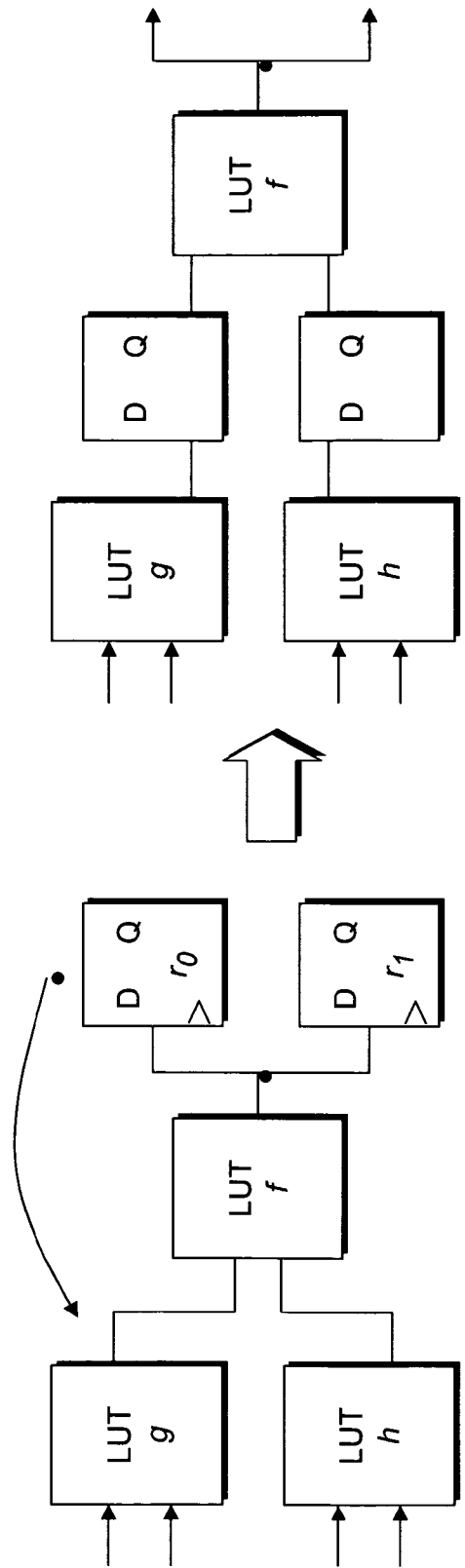
FIGS. 4a and 4b illustrate examples of backward and forward register retiming pushes according to an exemplary embodiment of the present invention.
Figure 4B:
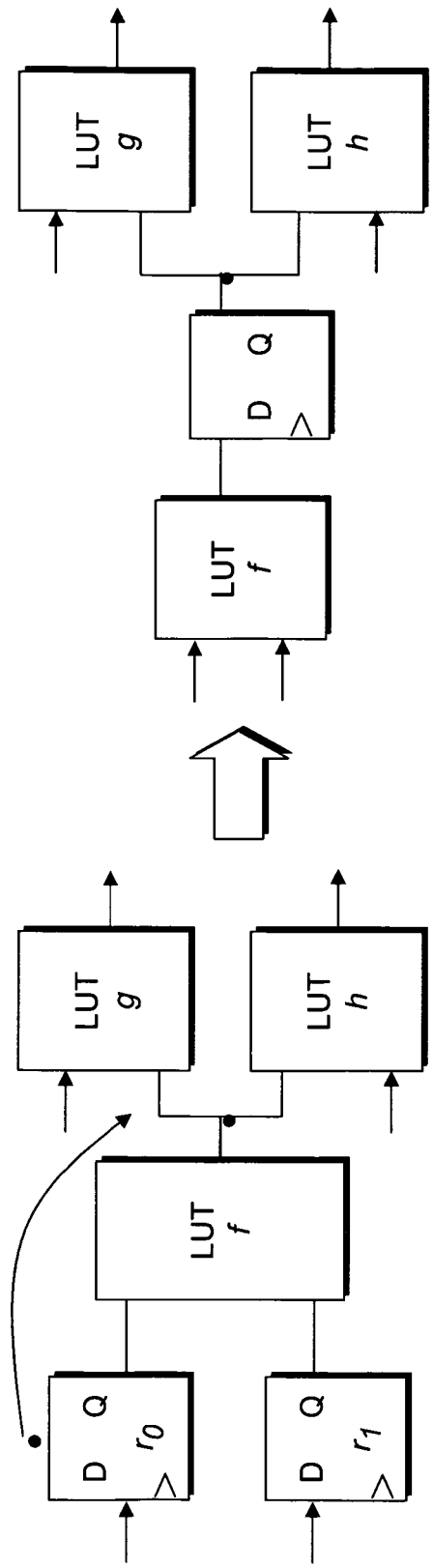

FIGS. 4a and 4b illustrate examples of backward and forward register retiming pushes according to an exemplary embodiment of the present invention. The backward and forward register retiming pushes illustrated may be performed at procedure 301 illustrated in FIG. 3. FIG. 4a illustrates an example of backward register retiming. During backward register retiming, one or more registers with inputs that come from a critical or near critical path are identified. The one or more registers are pushed backwards across the logic driving it as illustrated in FIG. 4a. FIG. 4b illustrates an example of forward register retiming. During forward register retiming, one or more registers with outputs that are connected to a critical or near critical path are identified. The one or more registers are pushed forward across the logic being driven as illustrated in FIG. 4b. During both backward and forward pushes, the functionality of the circuit remains unchanged.

Figure 5:
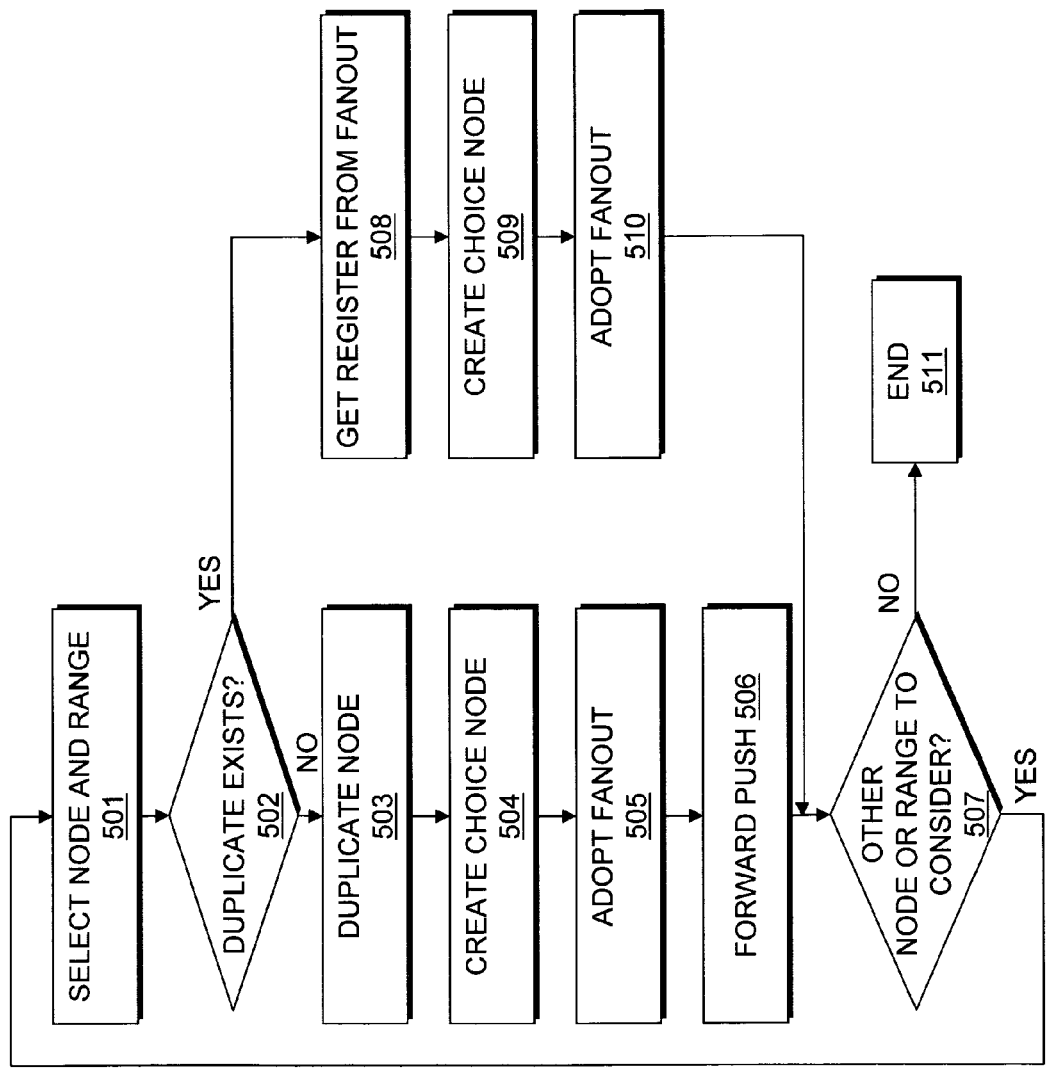
FIG. 5 illustrates an example of a method for performing forward push register retiming using a choice node according to an exemplary embodiment of the present invention.

FIG. 5 illustrates an example of a method for performing forward push register retiming using a choice node according to an exemplary embodiment of the present invention. The procedure illustrated in FIG. 5 may be used in part to implement procedures 301 and 302 illustrated in FIG. 3. At 501, a node in the design, $x_i$, for the system is selected along with a range to forward push. According to an embodiment of the present invention, the node may include combinational logic in a netlist.

At 502, it is determined whether a duplicate of the node, $x_{i-1}$, exists within the range. If it is determined that a duplicate does not exists, control proceeds to 503. If it is determined that a duplicate does exist, control proceeds to 508.

At 503, a duplicate of the node, is generated. The designation for the duplicated node is $x_{i-1}$.

At 504, a choice node, C, is created. The outputs of the node $x_i$ and the duplicate node $x_{i-1}$ are connected to the inputs of choice node C.

At 505, the fanout of the node x, is moved to the fanout of choice node C.

At 506, a register is created and placed at the output of the duplicate node $x_{i-1}$ (forward push).

At 507, it is determined whether another node or range has yet to be determined for the forward push register retiming. If another node or range exists to be considered for forward push register retiming, control proceeds to 501 where that node and/or range is selected. If no other node or range exists to be considered, control proceeds to 511.

At 508, a register from the fanout of the duplicate node $x_{i-1}$ is identified. The register is given the designation r.

At 509, a choice node, C, is created. The outputs of the node $x_i$ and the register r are connected to the inputs of choice node C.

At 510, the fanout of the node x, is moved to the fanout of choice node C. Control proceeds to 507.

At 511, control terminates the procedure.

The method for performing forward push register retiming using a choice node may also be implementing using the following pseudo code according to an exemplary embodiment of the present invention.

```
function FORWARDCHOICEPUSH(x_i)
  If notEXISTS(x_{i-1})
    x_{i-1}=DUPLICATENODE(x_i)
    C=CREATECHOICENODE(x_i, x_{i-1})
    ADOPTFANOUT(C,x_i)
    FORWARDPUSH(x_{i-1})
  else
    r=GETREGISTERFROMFANOUT(x_{i-1})
    C=CRATECHOICENODE(x_i, r)
    ADOPTFANOUT (C, x_i)
  end if
end function
```

Figure 6A:
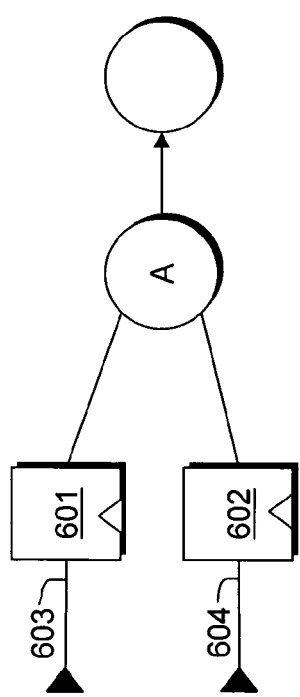
FIGS. 6a and 6b illustrate an example of performing forward push register retiming according to an exemplary embodiment of the present invention.
Figure 6B:
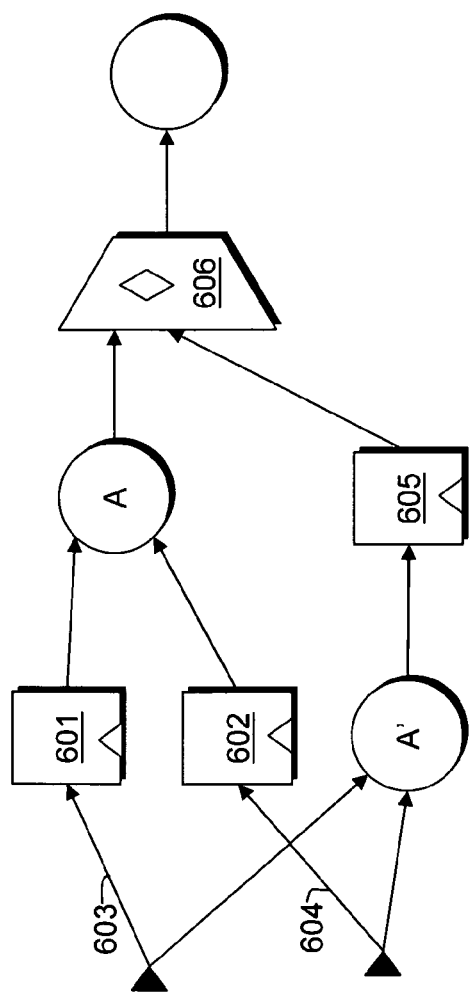

FIGS. 6a and 6b illustrate an example of performing forward push register retiming according to an exemplary embodiment of the present invention. FIG. 6a is an illustrative representation of a netlist of a circuit prior to performing forward push register retiming. The netlist includes a first register 601 on a first path 603 to node A and a second register 602 providing a second path to 604 node A.

FIG. 6b is an illustrative representation of a choice netlist that includes a forward push register retiming solution generated by the procedure illustrated in FIG. 5. Node A' represents a duplicate of node A. A new register 605 is included to represent the forward push of registers 601 and 602. Block 606 represents a choice node that receives register retiming solutions from nodes A and A'. Rather than requiring that a solution be immediately accepted or rejected from a register retiming procedure, a choice node allows a netlist to store one or more alternative solutions.

Figure 7:
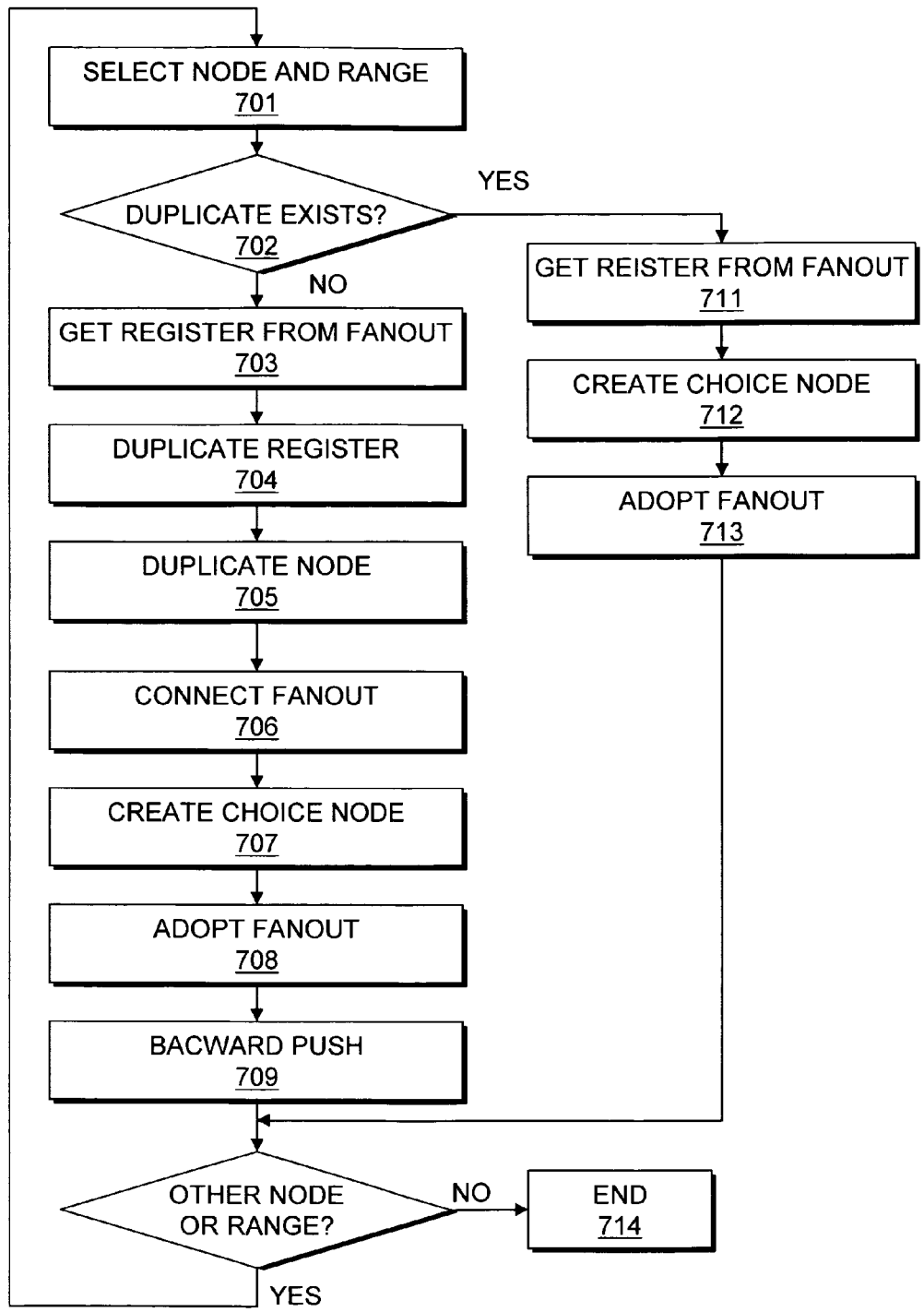
FIG. 7 illustrates an example of a method for performing backward push register retiming using a choice node according to an exemplary embodiment of the present invention.

FIG. 7 illustrates an example of a method for performing backward push register retiming using a choice node according to an exemplary embodiment of the present invention. The procedure illustrated in FIG. 7 may be used in part to implement procedures 301 and 302 illustrated in FIG. 3. At 701, a node in the design, $x_i$, for the system is selected along with a range to backward push. According to an embodiment of the present invention, the node may include combinational logic in a netlist.

At 702, it is determined whether a duplicate of the node, $x_{i+1}$, exists within the range. If it is determined that a duplicate does not exists, control proceeds to 703. If it is determined that a duplicate does exist, control proceeds to 711.

At 703, a register from the fanout of the duplicate node x, is identified. The register is given the designation r.

At 704, the register, r, is duplicated. The duplicated register is given the designation r'.

At 705, node $x_i$ is duplicated. The duplicated node is given the designation $x_{i+1}$.

At 706, the fanout of the duplicated node $x_{i+1}$ is connected to the duplicated register r'.

At 707, a choice node, C, is created. The output of register r and duplicated register r' is connected to the inputs of the choice node C.

At 708, the fanout of the register r is moved to the fanout of choice node C.

At 709, the register r' is pushed backward past node $x_{i+1}$ (backward push). If node $x_{i+1}$ includes more than one input, a copy of register r' is placed on each of the inputs.

At 710, it is determined whether another node or range has yet to be determined for the forward push register retiming. If another node or range exists to be considered for forward push register retiming, control proceeds to 701 where that node and/or range is selected. If no other node or range exists to be considered, control proceeds to 714.

At 711, a register from the fanout of the duplicate node $x_i$ is identified. This register is given the designation r.

At 712, a choice node, C, is created. The output of register r and duplicate node $x_{i+1}$ is connected to the inputs of the choice node C.

At 713, the fanout of the register r is moved to the fanout of choice node C. Control proceeds to 710.

At 714, control terminates the procedure.

The method for performing backward push register retiming using a choice node may also be implementing using the following pseudo code according to an exemplary embodiment of the present invention.

function BACKWARDCHOICEPUSH($x_i$)
  If notEXISTS($x_{i+1}$)
    r=GETREGISTERFROMFANOUT($x_i$)
    r'=DUPLICATENODE(r)
    $x_{i+1}$=DUPLICATENODE($x_i$)
    $x_{i+1}$=CONNECTFANOUT(r', $x_{i+1}$)
    C=CREATECHOICENODE (r, r')
    ADOPTFANOUT(C,r)
    BACKWARDPUSH($x_{i-1}$)
  else
    r=GETREGISTERFROMFANOUT($x_i$)
    C=CRATECHOICENODE(r, $x_{i+1}$)
    ADOPTFANOUT (C, r)
  end if
end function FIGS. 8a and 8b illustrate an example of performing backward push register retiming according to an exemplary embodiment of the present invention. FIG. 8a is an illustrative representation of a netlist of a circuit prior to performing backward push register retiming. The netlist includes a first path 801 to node B and a second path 802 to node B. The circuit 800 also includes a register 803 that registers an output from node B.

FIG. 8b is an illustrative representation of a choice netlist that includes a backward push register retiming solution generated by the procedure illustrated in FIG. 7. Node B' represents a duplicate of node B. New registers 804 and 805 are included to represent the backward push of register 803. Block 806 represents a choice node that receives register retiming solutions from nodes B and B'. Rather than requiring that a solution be immediately accepted or rejected from a register retiming procedure, a choice node allows a netlist to store one or more alternative solutions.

Figure 9A:
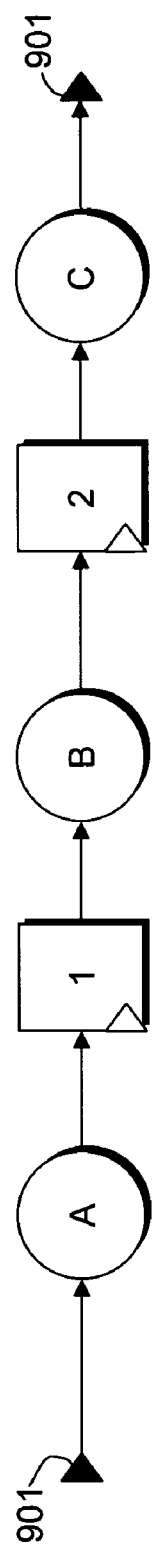
FIGS. 9a and 9b illustrate an example of performing register retiming according to an exemplary embodiment of the present invention.
Figure 9B:
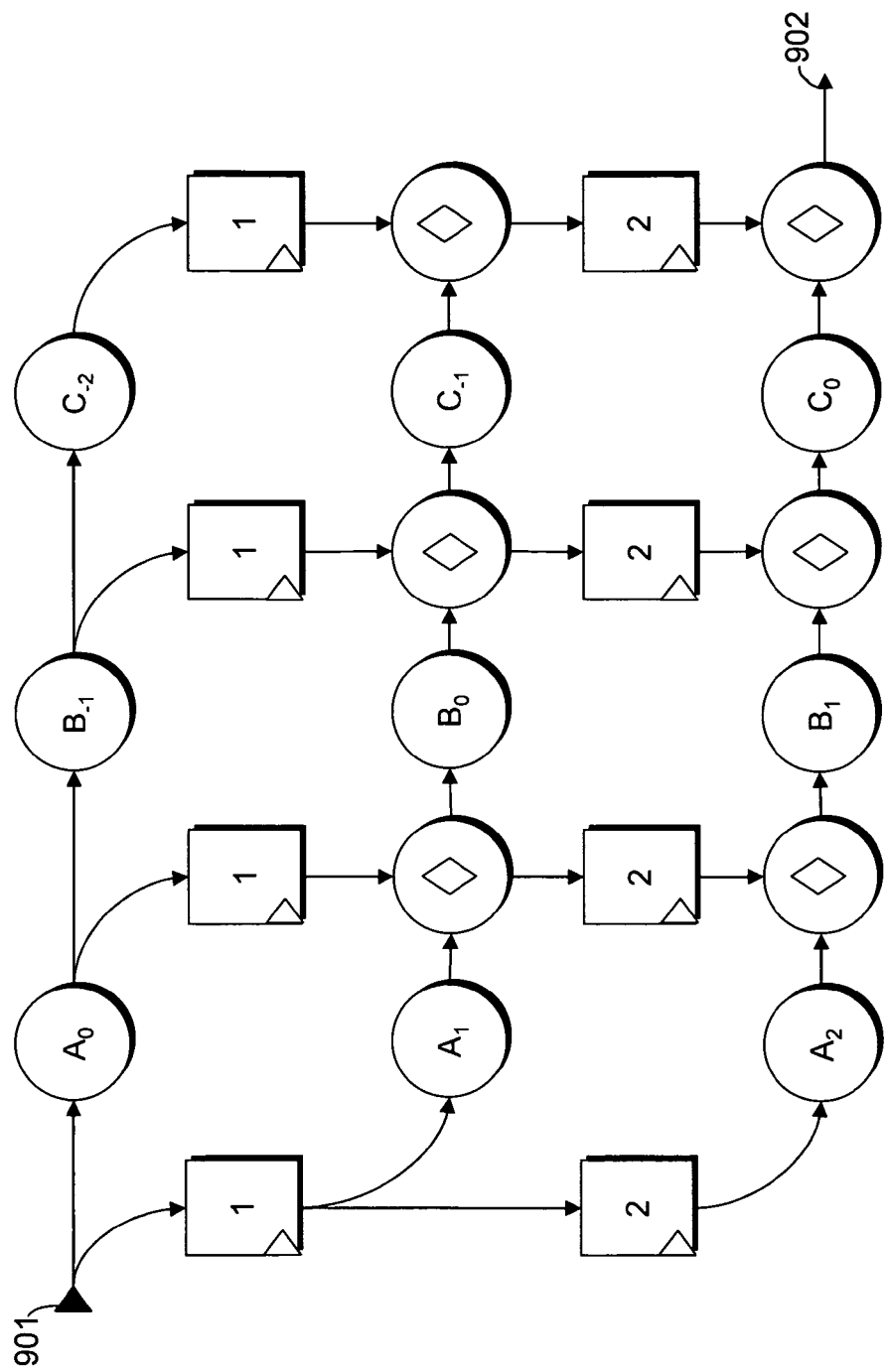

FIGS. 9a and 9b illustrate an example of performing register retiming according to an exemplary embodiment of the present invention. FIG. 9a is an illustrative representation of a netlist of a circuit prior to performing register retiming. The circuit includes an input 901 and an output 902. The circuit includes nodes A, B, and C. A first register 1 registers a signal output from node A. A second register 2 registers a signal output from node B.

FIG. 9b illustrates a choice netlist 950 after all register retiming solutions are identified using procedures illustrated in FIGS. 5 and 7. Note that for a given range limit R, the size of the netlist is bounded by O(nR), where n is the original size of the netlist. An index is added to each node. The integer value in each index distinguishes between multiple duplicates of the same combinational node. For a given combinational node X of index i, $X_{i+1}$ refers to the combinational node generated by a backwards push of a register across $X_i$. $X_{i-1}$ refers to the combinational node generated by the forward push of a register across $X_i$.

From the input 901, two alternative paths are present either register 1 or combinational node A. At the next level, reuse of portions of the choice netlist 950 by coalescing solutions is illustrated. For example, instead of listing and illustrating two possibilities in the tree separately (one for register 1 followed by combinational node A and another for combinational node A followed by register 1), the two possibilities are coalesced. The coalescing is possible because the two alternatives generate the same sequential logic values. Choice node 903 is used to indicate that one of the two register retiming solutions may be chosen. By coalescing the register retiming solutions, a smaller, more manageable type of netlist is created which may be more efficiently processed and stored.

Figure 10:
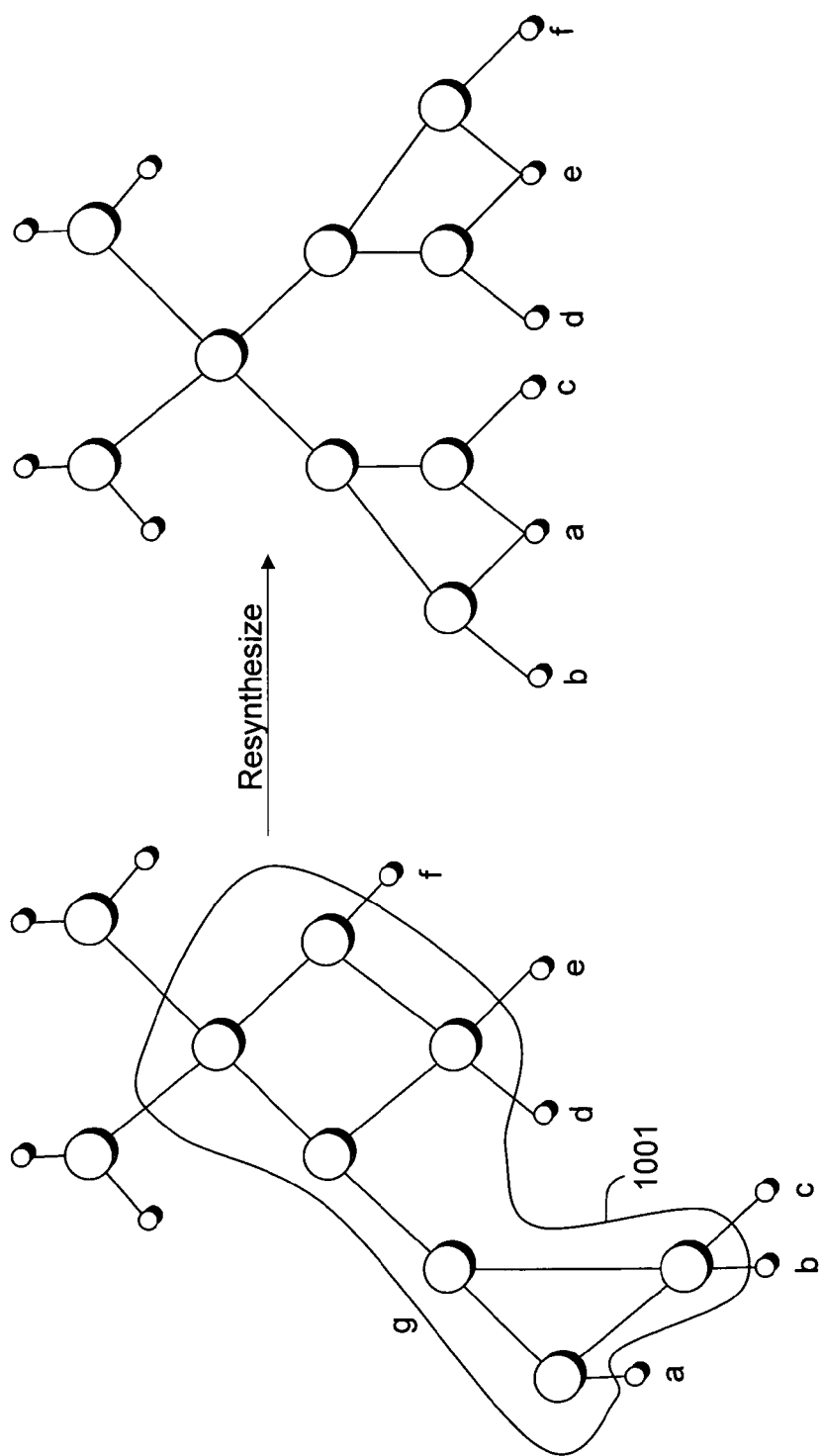
FIG. 10 illustrates an example of combinational resynthesis according to an exemplary embodiment of the present invention.

FIG. 10 illustrates an example of delay-driven combinational resynthesis according to an exemplary embodiment of the present invention which may be used to implement procedure 303 illustrated in FIG. 3. Combinational resynthesis modifies combinational logic to reduce the length of timing-critical paths. A cloud of combinational logic 1001 is selected for resynthesis. Using functional decomposition, Boolean division, or other techniques, a new cloud of combinational logic computing the same function may be determined. The new cloud of combinational logic shortens the delay from a critical input to the output at the expense of lengthening less timing-critical paths.

Figure 11:
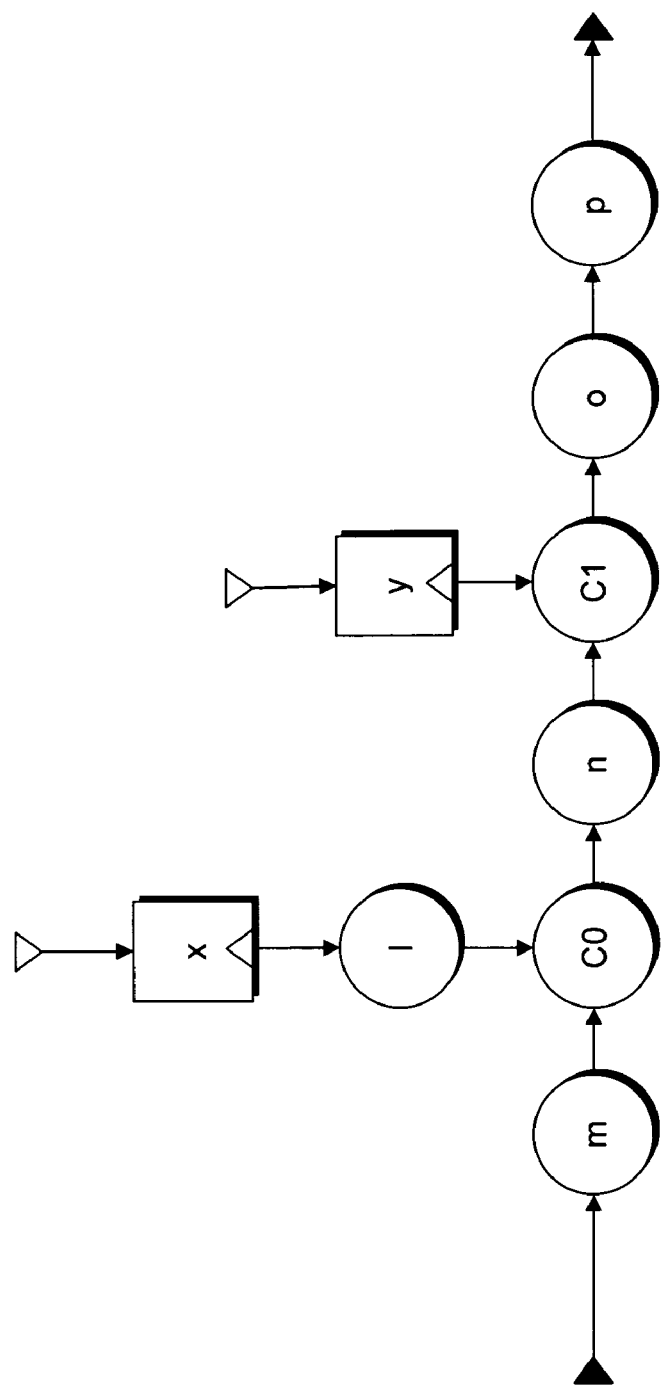
FIG. 11 illustrates an exemplary choice netlist according to an embodiment of the present invention.

According to an embodiment of the present invention, combinational resynthesis is performed on a choice netlist that represents a large number of alternate implementations of the original netlist. In this embodiment, combinational resynthesis procedures expand a cone around a selected seed node. The cone is then re-synthesized to meet a target goal such as area, speed, power, routability, or other goal. Some examples of resynthesis procedures include Boolean decomposition, Boolean division, and functional decomposition. When choice nodes are present in a network, additional guidelines are observed. FIG. 11 illustrates an exemplary choice netlist on which a resynthesis procedure is applied. First, when a cone is expanded past a choice node, a particular choice is made. If expansion is made past $C_1$, a choice is made between stopping the expansion at register y or continuing the expansion by including node n. This choice may be made in a random fashion, or if space and time permits, all possible choices may be explored. Second, when re-synthesized nodes are added to a netlist, a new choice node is introduced only if the seed node was not attached to a choice node. For example, if synthesis is performed starting at node n, then the re-synthesized results can be attached to the existing choice node $C_1$. However, if resynthesis is performed starting at node 0, a new choice node will need to be introduced between nodes o and p before the re-synthesized nodes are added to the netlist.

Figure 12:
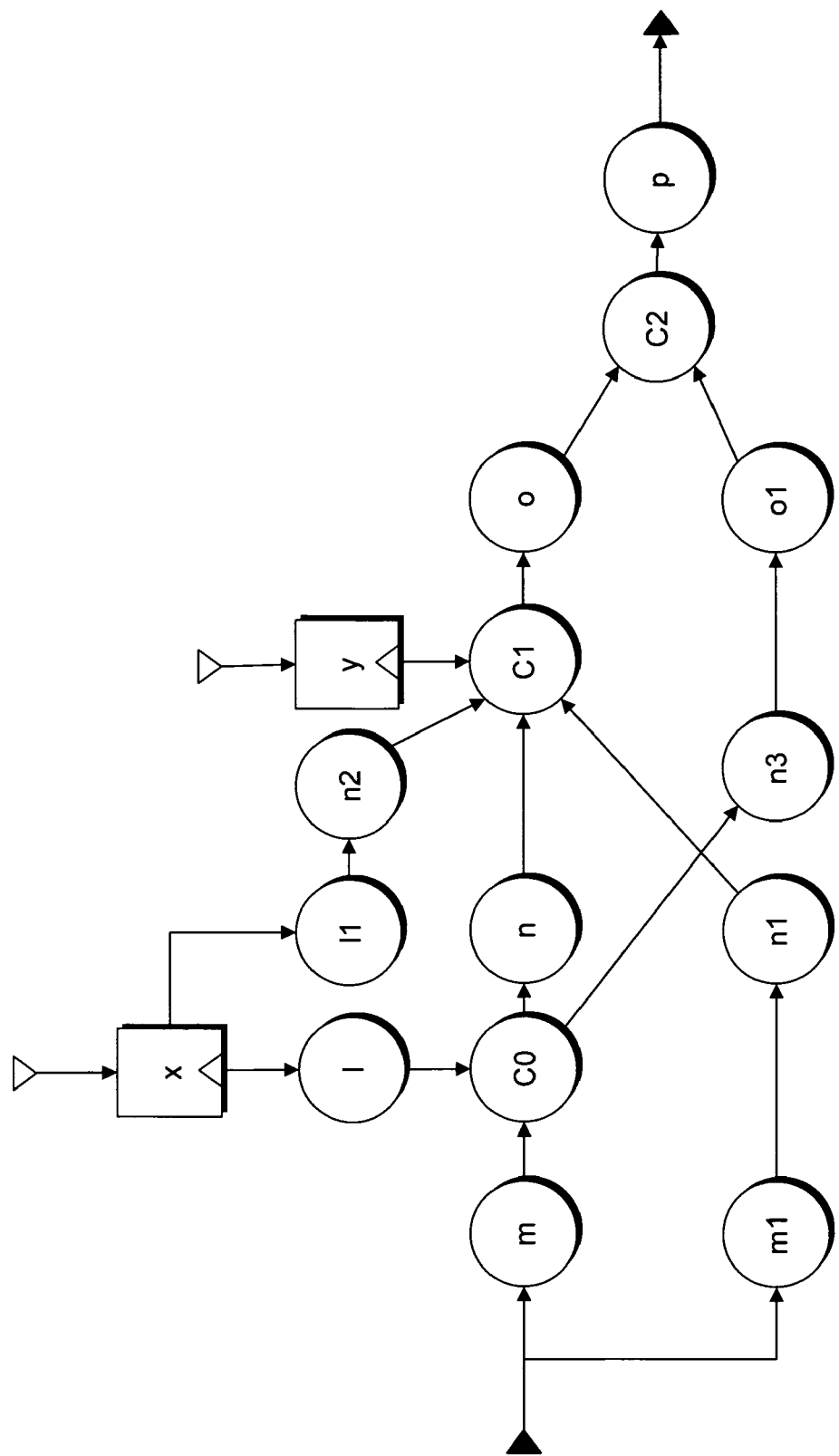
FIG. 12 illustrates an exemplary modified choice netlist after combinational resynthesis according to an embodiment of the present invention.

FIG. 12 illustrates a modified netlist of the choice netlist illustrated in FIG. 11 after application of a resynthesis algorithm. Notice that the resynthesis procedure expands a cone rooted at n. The resynthesis procedure expanded past $C_0$ and chose to include node m in the cone. Resynthesis of this cone results in new nodes $m_1$ and $n_1$ which are added back into the cone as an additional choice at $C_1$. Since there is some additional flexibility that was not used during the first expansion, a second expansion is started at n, but this time node 1 is included in the cone. New nodes $1_1$ and $n_2$ are the result of the resynthesis operation and are added as yet another choice at $C_1$. An expansion rooted at node o may also be considered. Node n is included in the cone and two new nodes $n_3$ and $o_1$ are produced by the resynthesis procedure. This time there is no choice node following node 0, therefore a new node $C_2$ is introduced before adding the nodes $n_3$ and $o_1$.

After a choice netlist has been modified to include solutions from both register retiming and combinational resynthesis, each unique permutation of the choice node configurations results in a different netlist. Each permutation may be referred to as a configuration of the choice netlist. It is desirable to analyze and evaluate all possible configurations of the choice netlist and determine which one results in the best final netlist. The best final netlist may be one which allows the system to have the best performance or lowest maximum register-to-register delay.

According to an embodiment of the present invention, procedure 304 illustrated in FIG. 3 may involve evaluating in parallel all possible configurations of the choice netlist. The evaluation procedure may use a dynamic programming technique that computes partial solutions. A partial solution at a given node includes a tuple (wc, $\Delta$slack), where wc is the worst-case register-to-register slack of any predecessor path, and $\Delta$slack is the delta slack improvement over the worst-case register-to-register slack of the current path.

Each node is associated with a pareto optimal set of partial solutions. A set of partial solutions (S) is pareto optimal if there exists no two partial solutions $(s_0, s_1)$ in the set such that $wc_{s0} > wc_{s1}$ and $\Delta slack_{s0} > \Delta slack_{s1}$. This would imply that so is always better than $s_1$, and $s_1$ never needs to be considered as it is dominated by $s_0$. It should be appreciated that slack ratio or other appropriate measure of criticality may be used in place of "slack".

Figure 13:
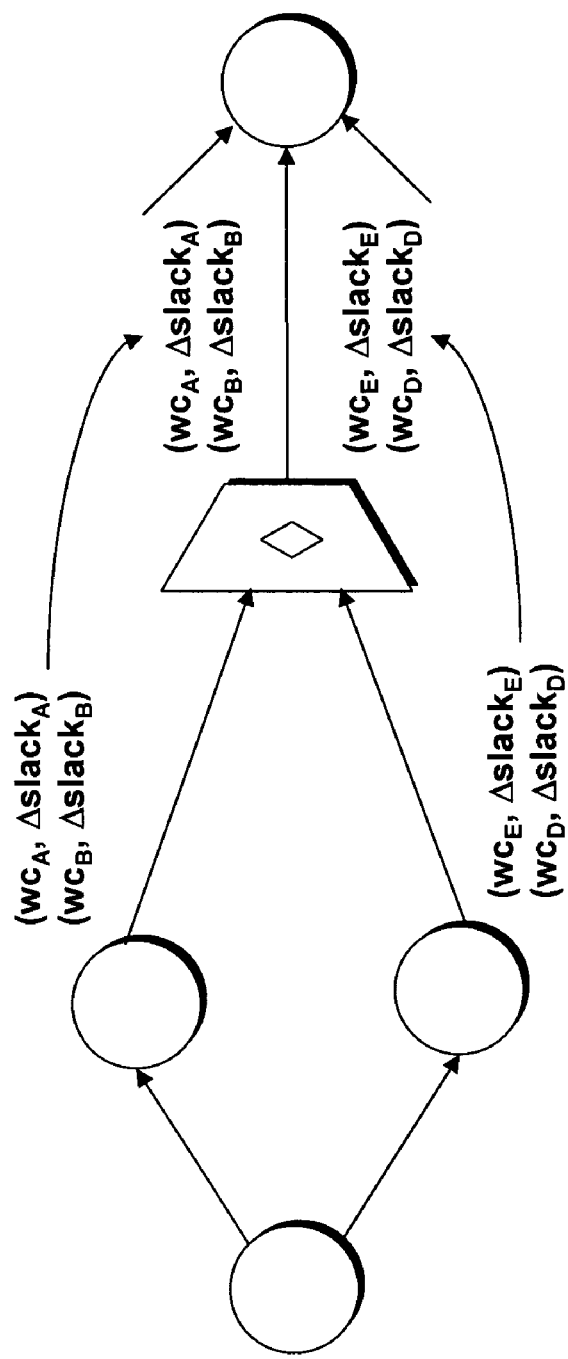
FIG. 13 illustrates propagating partial solutions over a choice node according to an exemplary embodiment of the present invention.

First, a timing analysis of the entire choice netlist is performed. This timing analysis calculates slacks and slack ratios for all connections in the choice netlist. All choice nodes are assumed to have zero delay. Available for each connection is the worst-case slack over all choice node configurations. The set of partial solutions at any given node (n) can be recursively calculated from the set of partial solutions at each of the fan-in (F). If the node n is a choice node, the set of partial solutions are the same union of the partial solutions at each of the choice node fan-ins. Dominated solutions are then removed from the union. This is shown in FIG. 13.

If the node n is not a choice node and not a register, each permutation of partial solutions, one from each of the fan-in, defines a partial solution at the node (n). The worst-case slack is given by the minimum of all of the fan-in worst-case slacks. The delta slack is given as the worst-case slack improvement over the connection's existing slack. The new partial solution may be represented by the relationship below for each permutation of partial solutions of the fan-in.

Figure 14:
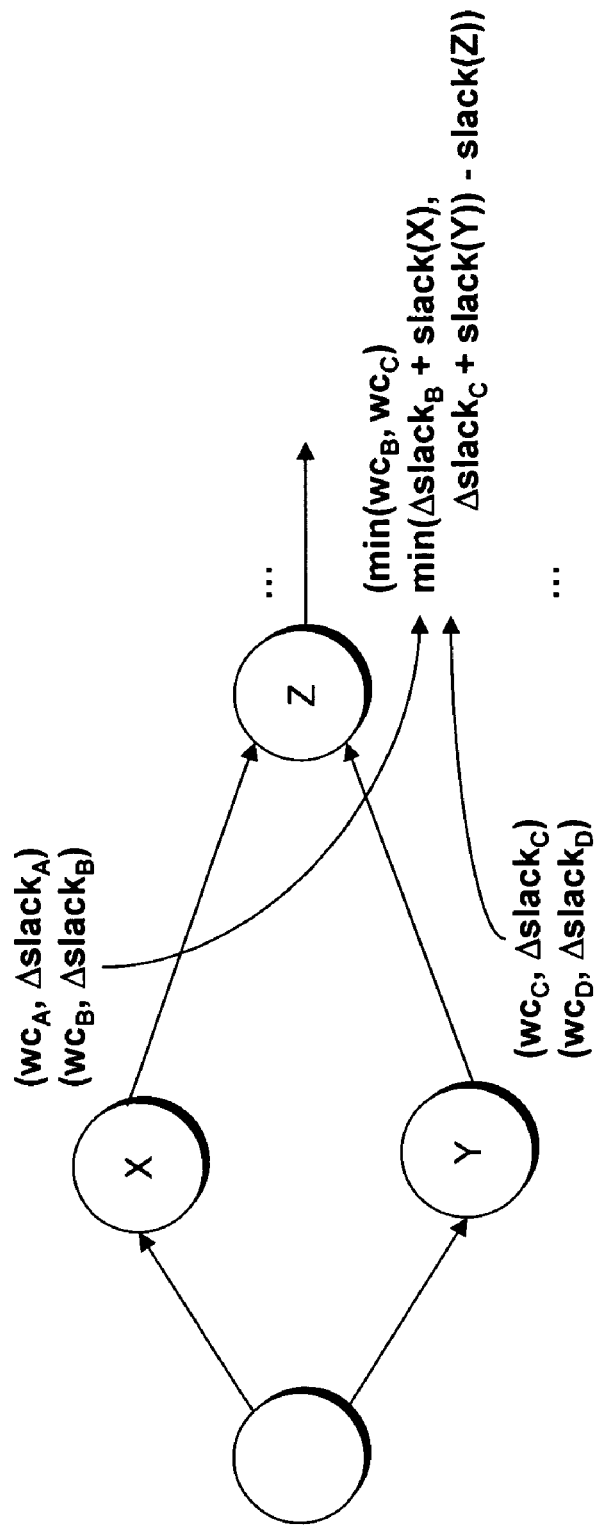
FIG. 14 illustrates propagating partial solutions over a non-choice node according to an exemplary embodiment of the present invention.

$wc_n = \min_{f \in F}(wc_f)$ $\Delta slack_n = \min_{f \in F}(\Delta slack_f + SLACK(f) - SLACK(n)))$ Dominated solutions are removed from the set. This is illustrated in FIG. 14.

If the node n is a register, each of the partial solutions at the input of the register defines a partial solution at the output. The worst-case slack is given by the minimum of the input worst-case slack and the slack of the input plus the slack delta. The delta slack is set to zero. The new partial solution may be represented by the relationship below for each of the input partial solutions.

$wc_n = \min(wc_f, SLACK(f) + \Delta slack_f)$ $\Delta slack_n = 0$

Figure 15:
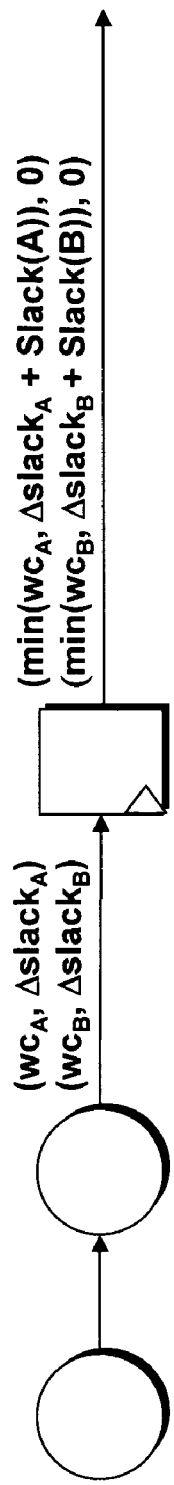
FIG. 15 illustrates propagating partial solutions over a register according to an embodiment of the present invention.

Dominated solutions are removed from the set. This is illustrated in FIG. 15.

After the set of new partial solutions is computed for node n, it is propagated and used in the calculation of the partial solutions on the fanout of n.

The initial solution set for all primary inputs is ($\infty$, 0). All partial solutions are calculated and propagated. When all partial solutions have been calculated, the best solution can be read from the primary outputs of the circuits. The best solution at each primary input is the solution with the highest worst-case slack. Using backtracking, the choice node settings that were required to produce the solution may be determined. The choice nodes can then be removed and the output hard-wired to the chosen input. The nodes implementing alternate choice may then be removed from the netlist. The resulting circuit is the best solution in the choice node netlist.

Figure 16:
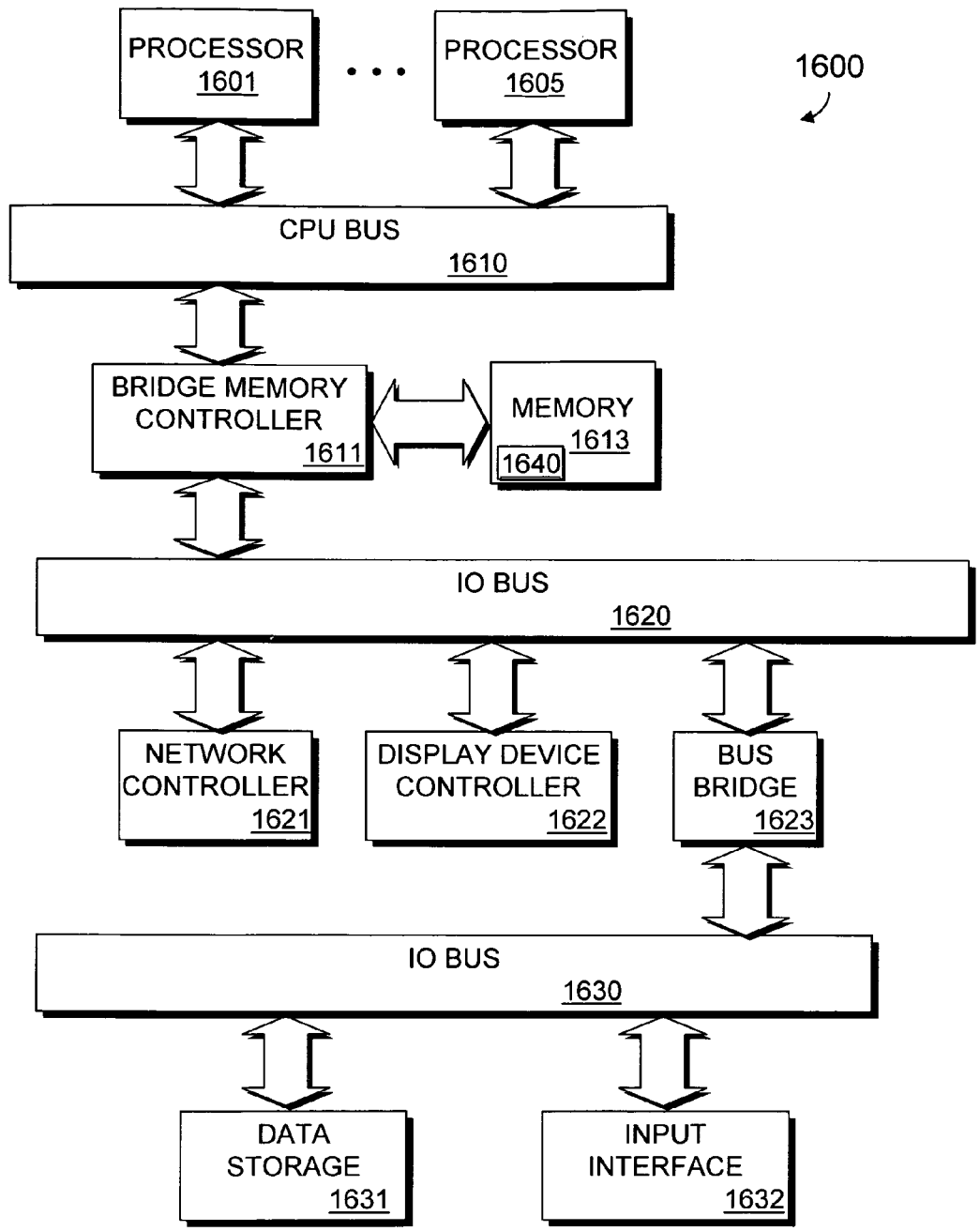
FIG. 16 illustrates a computer system that implements a system designer according to an exemplary embodiment of the present invention.

FIG. 16 is a block diagram of an exemplary computer system 1600 in which an example embodiment of the present invention resides. As shown, the computer system 1600 includes a single processor 1601. It should be appreciated that the computer system 1600 may include one or more processors that processes data signals. The processor 1601 is coupled to a CPU bus 1610 that transmits data signals between the processor 1601 and other components in the computer system 1600.

The computer system 1600 includes a memory 1613. The memory 1613 may store instructions and code represented by data signals that may be executed by the processor 1601. A bridge memory controller 1611 is coupled to the CPU bus 1610 and the memory 1613. The bridge memory controller 1611 directs data signals between the processor 1601, the memory 1613, and other components in the computer system 1600 and bridges the data signals between the CPU bus 1610, the memory 1613, and a first IO bus 1620.

The first IO bus 1620 may be a single bus or a combination of multiple buses. The first IO bus 1620 provides communication links between components in the computer system 1600. A network controller 1621 is coupled to the first IO bus 1620. The network controller 1621 may link the computer system 1600 to a network of computers (not shown) and supports communication among the machines. A display device controller 1622 is coupled to the first IO bus 1620. The display device controller 1622 allows coupling of a display device (not shown) to the computer system 1600 and acts as an interface between the display device and the computer system 1600.

A second IO bus 1630 may be a single bus or a combination of multiple buses. The second IO bus 1630 provides communication links between components in the computer system 1600. A data storage device 1631 is coupled to the second IO bus 1630. An input interface 1632 is coupled to the second IO bus 1630. The input interface 1632 allows coupling of an input device to the computer system 1600 and transmits data signals from an input device to the computer system 1600. A bus bridge 1623 couples the first IO bus 1620 to the second IO bus 1630. The bus bridge 1623 operates to buffer and bridge data signals between the first IO bus 1620 and the second IO bus 1630. It should be appreciated that computer systems having a different architecture may also be used to implement the computer system 1600.

A system designer 1640 may reside in memory 1613 and be executed by the processor 1601. The system designer 1640 may operate to synthesize a system, map the system, place the system on a target device, and perform physical synthesis on the system by identifying a plurality of register retiming solutions for each register in the system, performing combinational resynthesis on each of the retiming solutions, and selecting a combinational resynthesis solution for the system. According to an embodiment of the present invention, the system designer 1640 generates a choice netlist that represents the retiming solutions identified where the choice netlist includes choice nodes to allow a portion of the choice netlist for one retiming solution to be used as part of one or more other retiming solutions.

Figure 17:
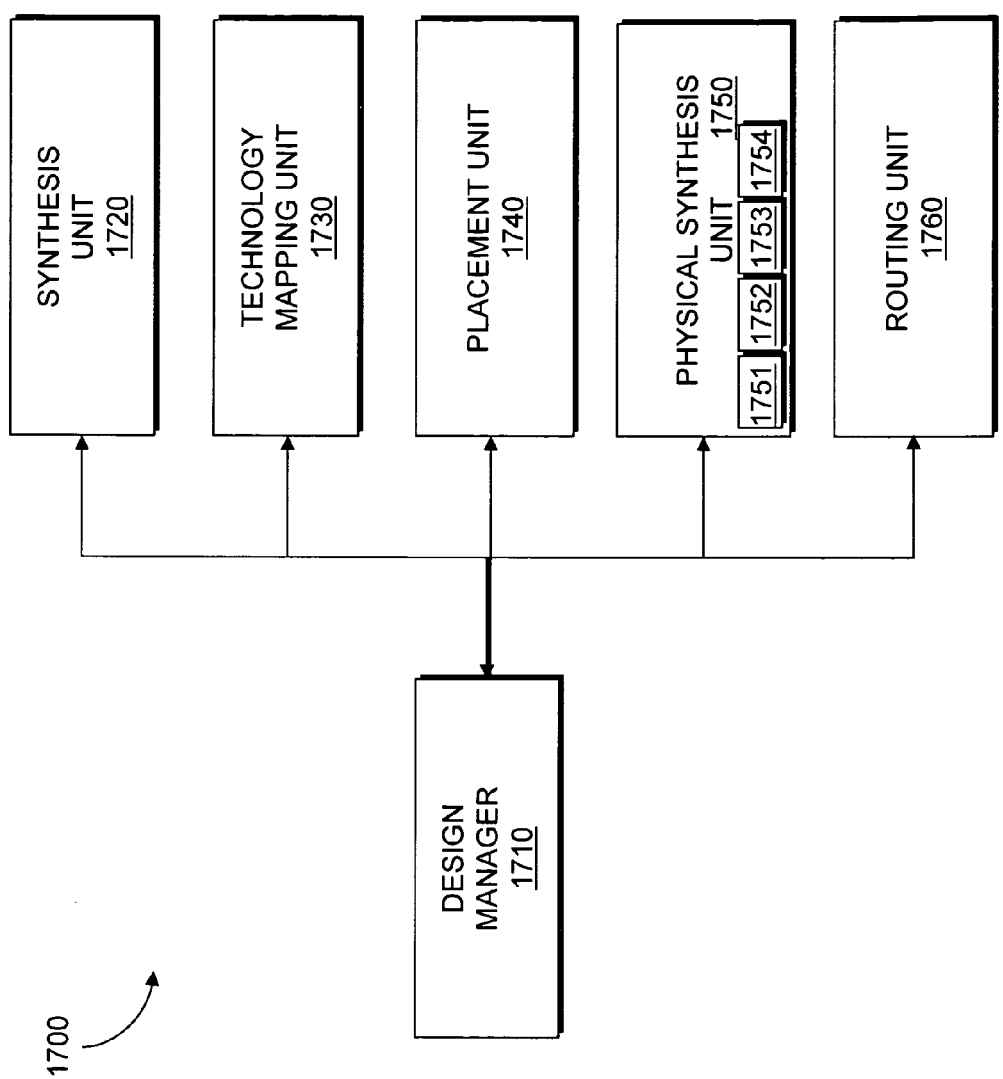
FIG. 17 illustrates a system designer according to an exemplary embodiment of the present invention.

FIG. 17 illustrates a system designer 1700 according to an exemplary embodiment of the present invention. The system designer 1700 may be an EDA tool for designing a system on a target device. The target device may be, for example, an FPGA, a PLD, or other circuitry. Furthermore the logic design may be implemented using semiconductor or nanoelectronic technology. FIG. 17 illustrates software modules implementing an embodiment of the present invention. According to one embodiment, system design may be performed by a computer system, such as the one shown in FIG. 16, executing sequences of instructions represented by the software modules shown in FIG. 17. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software. The system designer 1700 includes a designer manager 1710. The designer manager 1710 receives a design for a system. The design may be described at a gate level or in a more abstract level. The design may be described in terms of an HDL such as VHDL or Verilog. The designer manager 1710 is connected to and transmits data between the components of the system designer 1700.

Block 1700 represents a synthesis unit that performs synthesis. The synthesis unit 1700 generates a logic design of a system to be implemented in the target device. According to an embodiment of the system designer 1700, the synthesis unit 1720 takes a conceptual HDL design definition and generates an optimized logical representation of the system. The optimized logical representation of the system generated by the synthesis unit 1720 may include a representation that has a minimized number of functional blocks and registers, such as logic gates and logic elements, required for the system. Alternatively, the optimized logical representation of the system generated by the synthesis unit 1720 may include a representation that has a reduced depth of logic and that generates a lower signal propagation delay.

Block 1730 represents a technology mapping unit that performs technology mapping. The technology mapping unit 1730 determines how to implement the functional blocks and registers in the optimized logic representation utilizing specific resources on a target device thus creating an optimized "technology-mapped" netlist. The technology-mapped netlist illustrates how the resources (components) on the target device are utilized to implement the system.

Block 1740 represents a placement unit that performs placement. The placement unit 1740 places the system on to the target device by determining which components or areas on the target device are to be used for specific functional blocks and registers. According to an embodiment of the system designer 1700, the placement unit 1740 first determines how to implement portions of the optimized logic design in clusters. Clusters may represent a subset of the components on the logic design. A cluster may be represented, for example, by a number of standard cells grouped together. In this embodiment, after portions of the optimized logic design are implemented in clusters, the clusters may be placed by assigning the clusters to specific positions on the target device. The placement unit 1740 may utilize a cost function in order to determine a good assignment of resources on the target device.

Block 1750 represents a physical synthesis unit that performs physical synthesis. According to an embodiment of the present invention, physical synthesis includes a series of circuit transformations to optimize the circuit for a given goal. The circuit transformations occur outside the stage of design entry, synthesis, technology mapping, placement, and routing. Physical synthesis may be used to optimize a circuit for goals such as reducing a delay of a signal transmitted on a circuit, reduction of an area required for implementing the circuit on a target device, reducing the amount of power required for operating the circuit or the system, improving the routability of the circuit, and/or other goals. The physical synthesis unit 1750 includes a sequential register retiming unit 1751 to performed register retiming on the design for the system. Register retiming is a logic optimization technique for synchronous circuits. This technique moves registers across combinational circuit elements to reduce the length of timing-critical paths. Register retiming is performed on the entire design of the system such that all register retiming solutions are identified. More than one register retiming solution may be generated for each register in the system. According to an embodiment of the present invention, a limit is placed on retiming solutions that are identified. A range of registers, R, may be defined as the maximum number of combinational nodes a register can be pushed across. Performing pushes repeatedly will yield a choice netlist of size bounded by $O(n2^R)$, where n is the size of an original netlist The physical synthesis unit 1750 includes a choice netlist generation unit 1752 to generate a choice netlist to represent the register retiming solutions identified. According to an embodiment of the present invention, the choice netlist includes choice nodes which allow alternative solutions to be represented. Choice nodes allow a portion of the choice netlist for one retiming solution to be used as a part of one or more other retiming solutions. This allows a designer or an EDA tool to efficiently store a plurality of alternative solutions associated with a register without requiring the designer or EDA tool to accept a particular solution. It should be appreciated that register retiming and choice netlist generation may be implemented with a single procedure or a single unit.

The physical synthesis unit 1750 includes a combinational resynthesis unit 1753 to perform combinational resynthesis on the register retiming solutions identified. According to an embodiment of the present invention, the combinational resynthesis may be performed on the choice netlist generated. Combinational resynthesis operates to modify combinational logic reduce the length of timing-critical paths. Combinational resynthesis may include procedures such as decomposition (functional decomposition or Shannon's decomposition), Boolean division, and/or other procedures.

The physical synthesis unit 1750 includes an analysis unit 1754 to analyze the combinational resynthesis solutions generated. According to an embodiment of the present invention, the choice netlist which represents a plurality of candidates of alternate implementations of an original netlist with both register retiming and combinational resynthesis moves are evaluated. Each unique permutation of the choice node configurations results in a different netlist. Each permutation is a configuration of the choice netlist. According to one embodiment, all possible configurations are analyzed to determine which one results in the best final netlist. The best final netlist may include the configuration of the choice netlist that yields the highest performance, lowest maximum register-to-register delay, or other characteristic. The best final netlist determined is designated as the netlist for the system design.

Block 1760 represents a routing unit that performs routing. The routing unit 1760 determines the routing resources on the target device to use to provide interconnection between the components implementing functional blocks and registers of the logic design.

According to an embodiment of the system designer 1700, the design manager 1710 performs an assembly procedure that creates a data file that includes the design of the system generated by the system designer 1700. The data file may be a bit stream that may be used to program the target device. The design manager 1710 may output the data file so that the data file may be stored or alternatively transmitted to a separate machine used to further process the design for the system or to program the target device. It should be appreciated that the design manager 1710 may also output the design of the system in other forms such as on a display device or other medium.

FIGS. 1, 3, 5, and 7 are flow charts illustrating methods according to embodiments of the present invention. The techniques illustrated in these figures may be performed sequentially, in parallel or in an order other than that which is described. The techniques may be also be performed one or more times. It should be appreciated that not all of the techniques described are required to be performed, that additional techniques may be added, and that some of the illustrated techniques may be substituted with other techniques.

Embodiments of the present invention may be provided as a computer program product, or software, that may include an article of manufacture on a machine accessible or machine readable medium having instructions. The instructions on the machine accessible or machine readable medium may be used to program a computer system or other electronic device. The machine-readable medium may include, but is not limited to, floppy diskettes, optical disks, CD-ROMs, and magneto-optical disks or other type of media/machine-readable medium suitable for storing or transmitting electronic instructions. The techniques described herein are not limited to any particular software configuration. They may find applicability in any computing or processing environment. The terms "machine accessible medium" or "machine readable medium" used herein shall include any medium that is capable of storing, or encoding a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification embodiments of the invention has been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for designing a system on a target device, comprising:
synthesizing the system;
mapping the system;
placing the system on the target device; and
performing physical synthesis on the system, after placing the system and prior to routing the system, by identifying a plurality of register retiming solutions for each register in the system, generating a choice netlist that represents the plurality of register retiming solutions where choice nodes are connected to alternative register retiming solutions from the plurality of register retiming solutions, performing combinational resynthesis on each register retiming solution of the plurality of register retiming solutions, and selecting a combinational resynthesis solution for the system, wherein at least one of the synthesizing, mapping, placing, and performing is conducted using a processor.

2. The method of claim 1, wherein the plurality of register retiming solutions for each register is limited by a range value that indicates a number of combinational nodes a register may be pushed across.

3. The method of claim 1, wherein the choice netlist coalesces the plurality of register retiming solutions such that a portion of the choice netlist that includes one retiming solution of the plurality of register retiming solutions may be used as a part of one or more other register retiming solutions from the plurality of register retiming solutions.

4. The method of claim 1, wherein the choice netlist coalesces the plurality of register retiming solutions such that a size of the choice netlist is smaller than a size of a netlist that identifies each of the register retiming solutions from the plurality of register retiming solutions separately.

5. The method of claim 1, wherein performing combinational resynthesis on each of the register retiming solutions from the plurality of register retiming solutions comprises performing combinational resynthesis on the choice netlist.

6. The method of claim 5, wherein performing combinational resynthesis comprises performing decomposition.

7. The method of claim 5, wherein performing combinatorial resynthesis comprises performing Boolean division.

8. The method of claim 1, wherein selecting the combinational resynthesis solution for the system comprises determining at each node of the system one or more values that may be used as partial solutions for paths through the system.

9. The method of claim 1, wherein selecting the combinational resynthesis solution for the system comprises determining a worst-case register-to-register slack of a predecessor path and a delta slack improvement over a worst-case register-to-register slack of a path to each node in the system.

10. The method of claim 1, wherein performing physical synthesis comprises performing circuit transformations on a circuit in the system to optimize the system.

11. The method of claim 1, wherein performing physical synthesis comprises performing circuit transformations on a circuit in the system to optimize paths to satisfy timing constraints.

12. The method of claim 1, wherein performing physical synthesis comprises performing circuit transformations on a circuit in the system to reduce an area required for implementing the circuit.

13. The method of claim 1, wherein performing physical synthesis comprises performing circuit transformation on a circuit in the system to reduce power consumption.

14. The method of claim 1, wherein performing physical synthesis comprises performing circuit transformation on a circuit in the system to improve routability of the system.

15. The method of claim 1, further comprising outputting a design of the system to a machine to program the target device.

16. A non-transitory computer-readable medium including sequences of instructions stored thereon for causing a computer to execute a method, the method comprising:
   identifying a plurality of register retiming solutions for a system;
   generating a choice netlist that represents the plurality of register retiming solutions where choice nodes connect alternative register retiming solutions from the plurality of register retiming solutions;
   performing combinational resynthesis on the register retiming solutions represented on the choice netlist; and
   selecting an optimal combinational resynthesis solution for the system.

17. The non-transitory computer-readable medium of claim 16, wherein the plurality of register retiming solutions is limited by a range value that indicates a number of combinational nodes a register may be pushed across.

18. The non-transitory computer-readable medium of claim 16, wherein the choice netlist coalesces the plurality of register retiming solutions such that a size of the choice netlist is smaller than a size of a netlist that identifies each register retiming solution of the plurality of register retiming solutions separately.

19. A system designer, comprising:
   a synthesis unit operable to generate a design for a system;
   a mapping unit operable to determine how to implement the design with components available on a target device;
   a placement unit operable to determine which components on the target device to assign to the system; and
   a physical synthesis unit operable to identify a plurality of register retiming solutions for each register in the system, to generate a choice netlist that represents the plurality of register retiming solutions where choice nodes are connected to alternative register retiming solutions from the plurality of register retiming solutions, to perform combinational resynthesis on each register retiming solution of the plurality of register retiming solutions, and to select a combinational resynthesis solution for the system after the placement unit places the system and prior to routing the system, wherein at least one of the synthesis unit, mapping unit, placement unit, and physical synthesis unit is implemented in hardware.

20. The system designer of claim 19, wherein the physical synthesis unit comprises a choice netlist generation unit to generate a choice netlist that represents the plurality of register retiming solutions where choice nodes allow alternative solutions to be represented.

21. The system designer of claim 20, wherein the choice netlist generation unit coalesces the plurality or register retiming solutions such that a portion of the choice netlist that includes one register retiming solution of the plurality of register retiming solutions may be used as a part of one or more other register retiming solutions of the plurality of register retiming solutions.

* * * * *